United States Patent
Goldman et al.

(10) Patent No.: US 7,116,597 B1
(45) Date of Patent: Oct. 3, 2006

(54) HIGH PRECISION REFERENCE DEVICES AND METHODS

(75) Inventors: Matthew Goldman, Folsom, CA (US); Balaji Srinivasan, Fair Oaks, CA (US); Kerry D. Tedrow, Folsom, CA (US); Paul D. Ruby, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/026,347

(22) Filed: Dec. 30, 2004

(51) Int. Cl.
*G11C 7/02* (2006.01)

(52) U.S. Cl. ............ 365/210; 365/185.03; 365/185.21

(58) Field of Classification Search ................ 365/210, 365/185.03, 185.01, 185.05, 185.21, 185.09, 365/185.25, 185.2, 185.33
See application file for complete search history.

(56) References Cited

U.S. PATENT DOCUMENTS

| | | | |
|---|---|---|---|
| 6,128,219 A * | 10/2000 | Pio et al. ............... | 365/185.09 |
| 6,396,739 B1 | 5/2002 | Briner | |
| 6,510,072 B1 * | 1/2003 | Kang ..................... | 365/145 |
| 6,697,282 B1 | 2/2004 | Keeney et al. | |
| 6,724,658 B1 | 4/2004 | Micheloni et al. | |
| 6,813,209 B1 * | 11/2004 | Crain et al. ............ | 365/208 |
| 6,946,882 B1 * | 9/2005 | Gogl et al. ............. | 327/53 |
| 6,958,948 B1 * | 10/2005 | Shiraishi ................ | 365/230.05 |
| 2002/0015346 A1 * | 2/2002 | Jacquet et al. ......... | 365/210 |
| 2002/0085413 A1 | 7/2002 | Trivedi et al. | |
| 2002/0163844 A1 * | 11/2002 | Kurjanowicz ......... | 365/210 |
| 2003/0026133 A1 * | 2/2003 | Michael et al. ........ | 365/185.18 |
| 2003/0208663 A1 * | 11/2003 | Van Buskirk et al. .. | 711/156 |

* cited by examiner

*Primary Examiner*—Richard Elms
*Assistant Examiner*—Dang Nguyen
(74) *Attorney, Agent, or Firm*—Troutman Sanders LLP; Gerald R. Boss; James Hunt Yancey, Jr.

(57) ABSTRACT

The various embodiments of the present invention provide high precision reference devices, methods, and systems. A high precision reference device may include a plurality of reference cells to receive bias voltages and to provide a cell reference, and an averaging stage coupled to the reference cells to generate an average reference that is the average of the cell references. Other devices, methods, and systems are also claimed and described.

29 Claims, 4 Drawing Sheets

HIGH PRECISION REFERENCE DEVICES AND METHODS

BACKGROUND

Semiconductor manufacturing processes have continued to evolve since the early days of semiconductor technology. Although semiconductor manufacturers are continuing to design and implement new and improved manufacturing processes, data reliability and data integrity remain key concerns for semiconductor based memory systems. Storing data and retrieving stored data are important elements of any memory process. These elements must be efficiently and effectively performed to ensure proper memory device operation. For example, it is crucial that memory devices return data that accurately represents the stored data. If the returned data does not accurately represent what was stored, then data reliability issues may provide insurmountable problems for memory devices, and the hardware or software using the stored data. Many factors including manufacturing variances, environment and operating temperature variances, and physical size may effect memory device operation.

Typically retrieving stored data includes comparing the stored data to a known reference to determine the value of the stored data. Some memory devices compare stored current or voltage values to known reference thresholds to determine the logic state of the stored information. In the case of a multi-cell memory, the process of reading data may involve comparing the voltage or current generated from the stored data to a series of references to determine the value of the generated voltage relative to the references. Because some memory devices compare the stored data to a known reference, it is imperative that the known reference be stable and precise relative to its theoretical value. If the known reference greatly diverges from the known reference then comparison to the stored data may produce erroneous results. Stabilizing the reference may reduce data integrity issues thereby increasing the probability that stored data will always be read accurately.

What is needed, therefore, are devices and methods capable of ensuring a high precision reference threshold. A high precision reference device capable of producing a stable and precise reference threshold may assist to eliminate data integrity issues and increase the probability that data stored in a memory device maintains the correct logical state when retrieved. Additionally, a high precision reference method, system, and device may be capable of counteracting manufacturing inconsistencies to ensure that transistor density escalation will not increase data integrity and reliability issues.

DETAILED DESCRIPTION

The various embodiments of the present invention provide high-precision reference methods, devices, and systems. In some embodiments of the present invention, a non-volatile memory system may utilize a high precision current reference in determining the logical state of data stored in the non-volatile memory. Using the various embodiments of the invention may assist in alleviating data integrity issues associated with non-volatile memory devices when comparing stored data to a reference threshold. Some embodiments may be used in multi-level cell memory systems to ensure that read or retrieved data is in the same logical state as stored data. Still yet, the principles of the various embodiments of the invention may be applied to any memory system or device that may utilize a threshold reference to determine the logical state of stored data.

While many non-volatile memory system types exist, almost all such systems have similar read operation characteristics. When prompted to provide stored data in a read operation, a non-volatile memory system may access one or more memory elements containing stored data. Once the non-volatile memory system accesses the stored data, the current or voltage value associated with stored data is generally compared to a reference to determine the logical state of the data. In some memory systems, this reference may be a reference voltage, a reference current, or a combination of both. The comparison may enable the non-volatile memory system to sense if the stored data has a higher value or lower value relative to the reference. For example, if the reference is approximately 450 mA and the stored data is approximately 300 mA, then the stored data may have a low or "0" logical state. The read operation of a non-volatile memory system may greatly depend on a threshold reference, and any large variances in the threshold reference may result in non-volatile memory systems providing erroneous data in response to read operations.

Referring now the drawings, in which like numerals represent like elements, exemplary embodiments of the present invention are described below.

Figure 1:
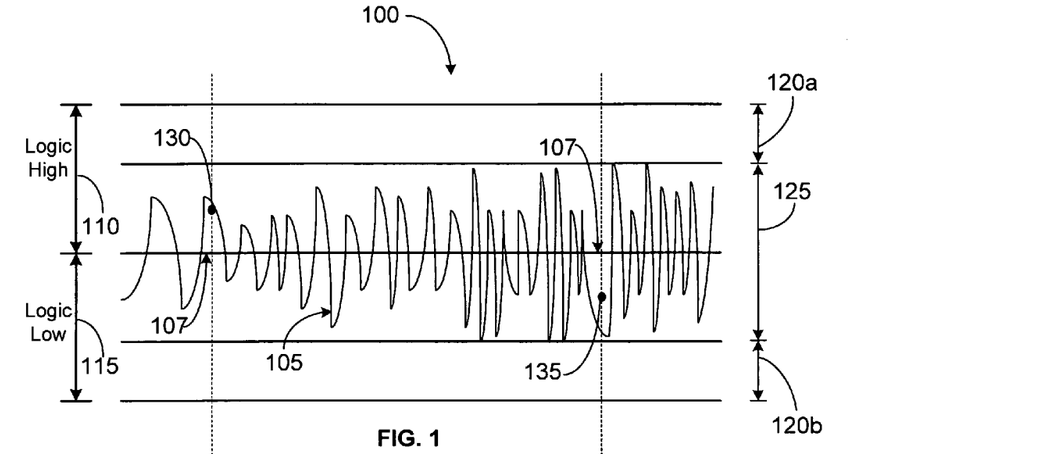
FIG. 1 illustrates a conventional reference threshold used in conventional memory devices.

FIG. 1 illustrates a conventional reference threshold used in conventional non-volatile memory devices. As shown the reference signal 105 has a theoretical value 107. Those skilled in the art will recognize that the theoretical value 107 may not reflect the actual value of the reference signal 105, and that the reference signal 105 is a model for the theoretical value 107. The reference signal 105 fluctuates above and below the theoretical value 107 in both the logic high 110 and logic low 115 ranges. The reference signal 105 fluctuates within the range 125 that includes both the logic high 110 and logic low 115 ranges. Although the reference signal 105 may have a theoretical value 107, manufacturing, temperature, and operating variances may cause the reference signal 105 to fluctuate above and below the theoretical value 107 within range 125 as shown in FIG. 1. In some instances, this fluctuation may not produce erroneous read operation results. But in other instances, the logical state of stored data may be erroneously provided based on the fluctuating reference signal 105.

The large fluctuations of the reference signal 105 may cause data integrity issues for both current references and voltage references utilized by non-volatile memory systems. For example, suppose that a logical high data bit is stored into a non-volatile memory and when read from the memory, the logical high data bit has a current or voltage value corresponding to value 130 at T1. As shown, the reference signal 105 has risen above approximate value 107 at T1 and is greater than the value 130 at T1. After comparing the two values (reference signal 105 and the value 130 at T1), the non-volatile memory system may sense that the value 130 as a logical low when it actually is a logical high data bit.

Similarly, suppose that at logical low data bit is stored into a non-volatile memory system and when read, the logical low data bit has a current or voltage corresponding to a value 135 at T2. As shown, reference signal 105 has a lower value than the value 135 at T2, and the reference signal 105 has a lower value than the value of 107 and has fallen below the value 135 at T2. When the non-volatile memory system compares the reference signal 105 to the value 135 at T2, the non-volatile memory system may incorrectly provide a logical high bit as a memory output due to the reference signal's 105 large deviation from the approximate value 107 at T2. To ensure that fluctuations in she reference signal 105 do not cause data integrity issues, the data bits being react from a non-volatile memory system need to have values outside of range 125 and in ranges 120a–b. This requirement, however, may place a considerable burden on a memory system, and may create issues or constrain the design parameters for other logical devices interacting with a memory system.

Figure 2:
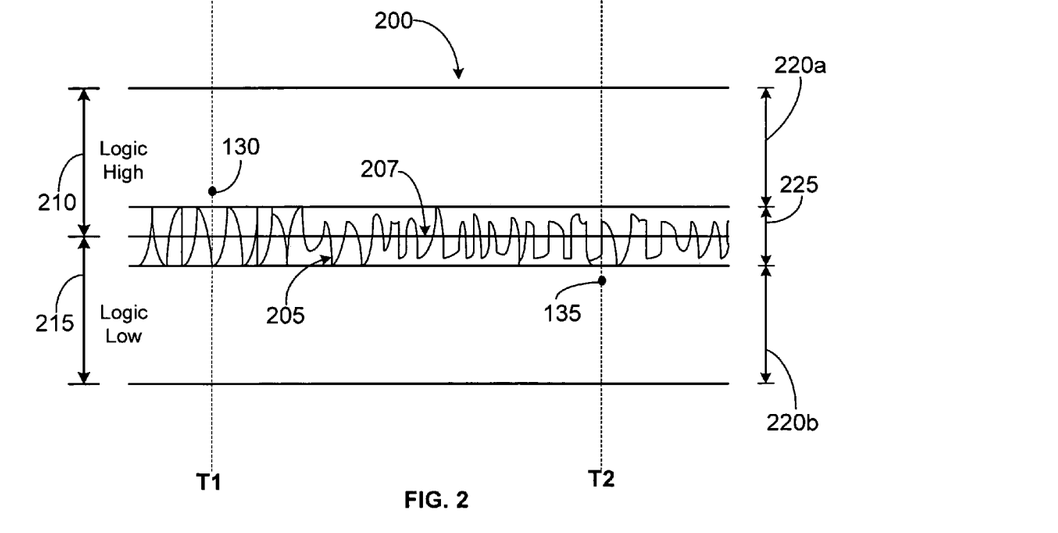
FIG. 2 illustrates a high-precision stabilized reference threshold in accordance with the various embodiments of the present invention.

FIG. 2 illustrates a high-precision stabilized reference threshold in accordance with the various embodiments of the present invention. As illustrated, a high-precision threshold reference signal 205 has a theoretical value 207 providing a threshold between the logic high range 210 and the logic low range 215. The reference signal 205 may be bounded in range 225 such that the reference signal 205 does not diverge widely from the theoretical value 207. Also shown are ranges 220a–b which identify the portions of the logic high 210 and logic low 215 ranges that may not produce data integrity issues.

A comparison between FIG. 1 and FIG. 2 illustrates the need for a high precision threshold reference as contemplated by the various embodiments of the present invention. As illustrated, the reference signal 205 is closer to the theoretical value 207 than the reference signal 105 is closer to the theoretical value 107. Since the reference signal 205 is closer to the theoretical value 207 relative to the reference signal 105 and the theoretical value 107, the non-volatile memory system utilizing the reference signal 205 may generally provide more reliable data than if it utilized reference signal 105. For example at T1, a non-volatile memory system using reference signal 205 may correctly provide current value 130 as a logical high rather than a logical low because current value 130 is greater than the value of the reference signal 205 at T1. Similarly at T2, by using the reference signal 205 rather than the reference signal 105, a non-volatile memory system may correctly provide voltage value 135 as a logical low rather than a logical high because the voltage value 135 is less than the value of the reference signal 205 at T2 by biasing the memory elements 305.

Figure 3:
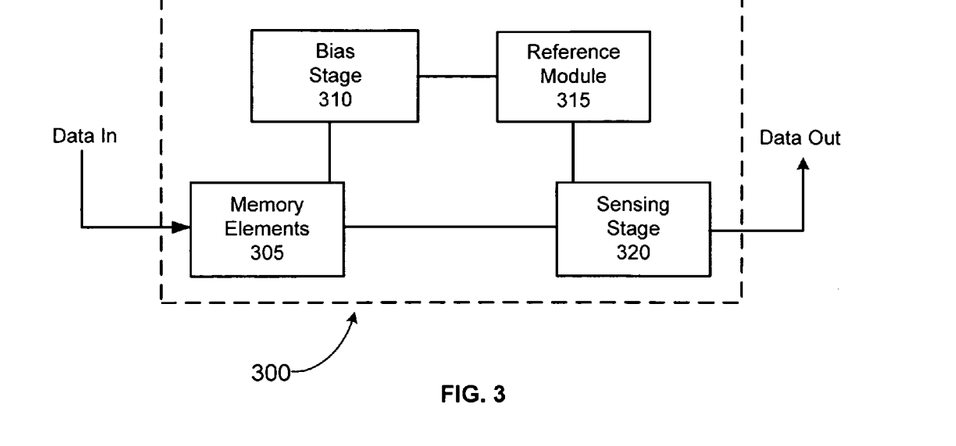
FIG. 3 depicts a non-volatile memory system using a high-precision reference threshold according to some embodiments of the invention.

FIG. 3 depicts a non-volatile memory system using a high-precision threshold reference threshold according to some embodiments of the invention. The non-volatile memory system 300 may include a plurality of memory elements 305, a bias stage 310, a reference module 315, and a sensing stage 320. Each stage may be coupled to each other to enable each stage to receive and transmit data to each other, and also to provide operating voltages or currents to each other. For example, the memory elements 305 may be coupled to the bias stage 310, the reference module 315, and the sensing stage 320 to provide these stages with data stored in the memory elements 305. Also, the bias stage 310 may be coupled to the memory elements 305 and the reference module 315 to provide these stages with the bias voltages utilized by the memory elements 305. The bias voltages may control the memory elements 305.

Non-volatile memory system 300 may receive and provide various signals and may be connected to various voltages. The non-volatile memory system 300 may receive incoming data (Data In) to be stored in the memory elements 305 and may output stored data (Data Out) from the sensing stage 320. Although not shown in FIG. 3, the non-volatile memory system may also be connected to a plurality of operating voltages including a supply voltage (Vin), a reference voltage (Vref) such as ground, and a controller or processor to control the non-volatile memory system 300.

In operation, the memory elements 305 may store data provided by another logic device in response to a write operation. The memory elements 305 may be volatile or nonvolatile type memories such as, but not limited to, flash memory, multi-level flash memory, or random access memory. Those skilled in the art will also recognize that memory elements 305 may be any type of memory capable of storing memory, including volatile memory, that may utilize or interact with a threshold reference to determine the logical state of stored data. The memory elements 305 may provide stored data in response to a read operation received by memory system 300.

Upon receiving a read operation, the memory elements 305 may provide the stored data to the sensing stage 320. The sensing stage 320 may output data as illustrated in FIG. 3. Prior to outputting data, the sensing stage 320 may compare the voltage value or current value associated with the retrieved, stored data to a threshold reference provided by the reference module 315. The reference module 315 may comprise a plurality of matched cells as discussed in greater detail below. The matched cells may be identical to each other (e.g., same components, configuration, and operating conditions), the memory cells in the memory elements 305, or a combination of both. Each cell within the reference module 315 may generate a cell reference. In some embodiments, the reference module 315 may generate the threshold reference in response to the plurality of cell references provided by the matched cells. For example, and not by limitation, the reference module 315 may generate an average threshold reference by averaging all of the cell references. An averaged threshold reference may cancel out the variations seen in the individual cell references and may deliver a more precise reference as compared to the individual cell references. In other embodiments, the reference module 315 may generate different types of threshold references using all or some of the individual cell references. For example, the averaged threshold may be scaled by adding multiple outputs to provide scaled average reference thresholds. Such scaled averages may be accomplished by adding additional averaging stages as discussed in greater detail below.

Figure 4:
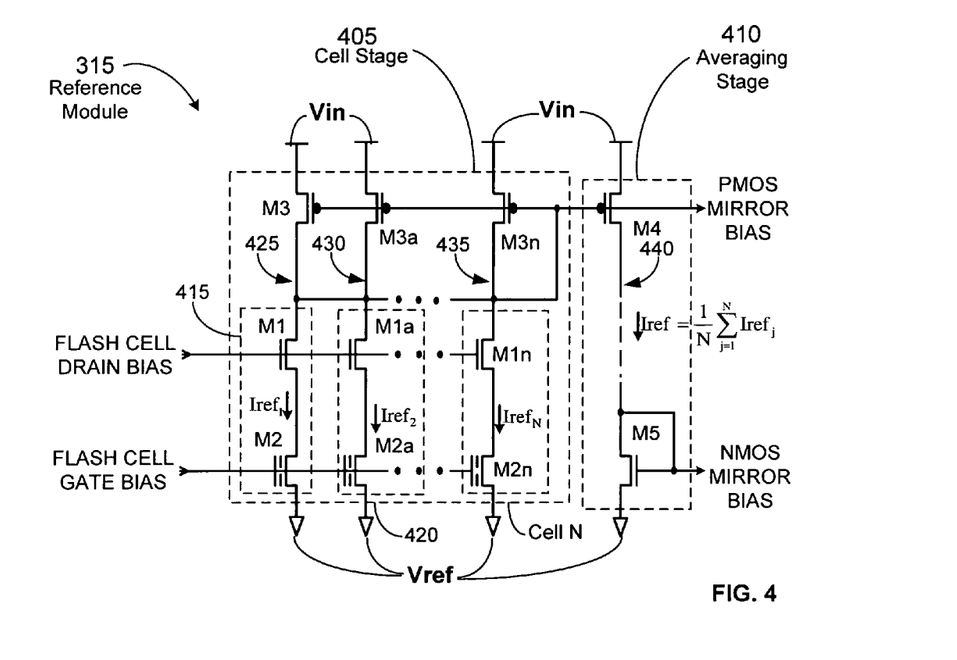
FIG. 4 illustrates a high-precision reference circuit that may be utilized according to some embodiments of the present invention.

FIG. 4 illustrates a high-precision threshold reference module 315 according to some embodiments of the present invention. As shown, the reference module 315 may include a cell stage 405 coupled to an averaging stage 410. The cell stage 405 may include a plurality of reference cells 415, 420, and Cell N. Those skilled in the art will recognize that Cell N denotes N cells or a plurality of cells. The cell stage 405 may be connected to a supply voltage (Vin), a reference voltage (Vref) such as ground, and may receive two bias voltages (flash cell drain bias and flash cell gate bias). The supply (Vin) and reference voltage (Vref) may be provided from an on- or off-power supply, a bias stage such as the bias stage 310, or another voltage source. The two bias voltages (flash cell drain bias and flash cell gate bias) may be provided by the same power source such as bias stage 310, and may be the same bias voltages provided to the memory elements 305. Providing the same bias voltages from bias stage 310 to the memory elements 305 and the reference module 315 may ensure that any variation in the bias voltage is common to both the memory elements 305 and the reference module 315. The averaging stage 410 may also be connected to the supply voltage (Vin) and the reference voltage (Vref). The cell stage 405 and the averaging stage 410 may be coupled together using a current mirror configuration as shown in FIG. 4 and as discussed in greater detail below.

The cells 415, 420, and Cell N composing the cell stage 405 may each include two transistors each having three terminals. For example as illustrated in FIG. 4, a first reference cell 415 may include two transistors M1 and M2; the second reference cell 420 may include two transistors M1a and M2a; and the Nth reference cell (Cell N) may include two transistors M1n and M2n. The various embodiments of the present invention may utilize p-type or n-type complementary metal oxide transistors (CMOS). Transistors M1, M1a, M1n, M2, M2a, and M2n may be n-type or p-type transistors. As illustrated in FIG. 4, transistors M1, M1a, M1n, M2, M2a, and M2n are n-type transistors. The reference cells 415, 420, and Cell N, may also be coupled to transistors M3, M3a, and M3n in a current mirror configuration as discussed below in greater detail.

Each cell 415, 420, and Cell N may also provide a cell reference. The cell reference may be a current reference or a voltage reference. For example, the first cell 415 may provide $Iref_1$ as a first cell reference, the second cell 420 may provide $Iref_2$ as a second cell reference, and the Nth cell (Cell N) may provide $Iref_N$ as the Nth cell reference. Those skilled in the art will recognize that references to the Nth cell reference, or component N (or n) denotes a plurality of cell references and components which may be utilized according to the various embodiments of the present invention.

Each transistor within the plurality of cells 415, 420, and Cell N may be similarly configured. For example in the first cell 415, the drain of the first transistor M1 may provide the first cell reference $Iref_1$ to the averaging stage 410, the gate of the first transistor M1 may receive a first bias voltage (or a flash cell drain bias voltage), and the source of M1 may be connected to the drain of the second transistor M2. And the gate of the second transistor M2 may receive the second bias voltage (or a flash cell gate bias voltage) and the source of the second transistor M2 may be connected to a reference voltage (Vref) such as ground. Likewise in the nth cell (Cell N), the drain of the M1n may provide the nth cell reference $Iref_N$ to the averaging stage 410, the gate of transistor M1n may receive a first bias voltage (or a flash cell drain bias voltage), and the source of transistor M1n may be connected to the drain of transistor M2n. And the gate of transistor M2n may receive the second bias voltage (or a flash cell gate bias voltage) and the source of transistor M2n may be connected a reference voltage such as ground. Those skilled in the art will recognize from FIG. 4 that the second cell 420 is configured similarly to the first cell 415 and Nth cell (Cell N).

The cell stage 405 may also include other transistors coupled to the cells 415, 420, and Cell N. As shown in FIG. 4, transistors M3, M3a, and M3n may be configured in a current mirror configuration. Specifically, the gates of transistors M3, M3a, and M3n may be coupled to the gate of transistor M4. Additionally, the sources of transistors M3, M3a, and M3n may be connected to the supply voltage (Vin) and the drains of transistors M3, M3a, and M3n may be connected to the gate of transistor M3n and the gate of transistor M4. Transistors M3, M3a, and M3n may be p-type or n-type transistors. As shown in FIG. 4, transistors M3, M3a, and M3n are p-type transistors.

The reference module 315 may also include an averaging stage 410 coupled to the cell stage 405. This feature of some embodiments of the invention may enable the reference module 315 to average the first cell reference $Iref_1$, the second cell reference $Iref_2$, and the Nth cell reference $Iref_N$ to provide an average threshold reference such as Iref. As the summation equation in FIG. 4 provides, Iref may be approximately equal to the sum of all the cell references divided by the number of reference cells (or $$\left(\text{or } Iref = \frac{1}{N}\sum_{j=1}^{N} Iref_j\right).$$

Although the average threshold reference generated by reference module 315 is a current value, other embodiments of the present invention may generate a voltage value for an average threshold reference. For example, a reference voltage may be generated by measuring the voltage drop across a resistive device with current Iref flowing through the resistive device.

The averaging stage 410 may include two transistors M4 and M5, each having three terminals. Transistors M4 and M5 may be a p-type or n-type transistor. As shown in FIG. 4 in an exemplary embodiment, transistor M4 is a p-type transistor and transistor M5 is an n-type transistor. As also illustrated in FIG. 4, the source of M4 may be connected to the supply voltage (Vin), the gate of M4 may be connected to the gates and drains of transistors M3, M3a, and M3n. The drain of M4 may be connected to the drain of M5 and may provide the averaged threshold reference Iref to the drain and gate of M5. The source of M5 may be connected to a reference voltage (Vref) such as ground.

In an exemplary embodiment of the present invention illustrated in FIG. 4, the average threshold reference Iref may be an average of the individual cell references $Iref_1$, $Iref_2$, $Iref_N$. Iref may be determined by the ratio of output legs 440 versus input legs 425, 430, 435. Input leg 425 may be formed by the connection of the drain of transistor M3 and the drain of transistor M1, input leg 430 may be formed by the connection of the drain of transistor M3a and the drain of transistor M1a, and input leg 435 may be formed by the connection of the drain of transistor M3n and the drain of transistor M1n. The output leg 440 may be formed by the connection between the drain of transistor M4 and the drain of transistor M5. Thus, as shown in FIG. 4, since there are three input legs (input legs 425, 430, 435) and only a single output leg (output leg 440), the output current, Iref, is ⅓ the sum of the cell reference currents, or $(Iref_1+Iref_2+Iref_N)/N$, wherein N is the number of output legs (in this case 3).

Additional output legs may be added to the averaging stage 410 to provide scaled average references. For example, the circuitry shown in the averaging stage (transistors M4 and M5) may be replicated and similarly configured to provide a scaled average reference. More specifically, another PMOS and NMOS transistor may be configured exactly as transistors M4 and M5 to provide a scaled average reference (Iref) given by M*(Iref1+Iref2+IreN)/N, wherein N is the number of input legs and M is the number of output legs. The additional output legs may be formed by the connection between the drain of the additional PMOS Transistors and the drain of the additional NMOS transistors. Those skilled in the art will understand and recognize that various ratios of input legs to output legs are possible according to the various embodiments of the present invention simply by varying the number of output and input legs.

The average threshold reference may produce a reference that eliminates or cancels out the variations in a single cell reference. For example, the average cell reference may average a plurality of reference signals closely resembling the reference signal 105 in FIG. 1 to produce the reference signal 205 in FIG. 2. The variations in a cell reference may be caused by manufacturing variances or temperature variances. Although the cell references discussed in relation to FIG. 4 are current-type cell references, some embodiments of the present invention can also cancel out variations in voltage-type references. For example, some embodiments may generate a threshold reference in response to a plurality of voltage cell references including an averaged voltage threshold reference.

Figure 5:
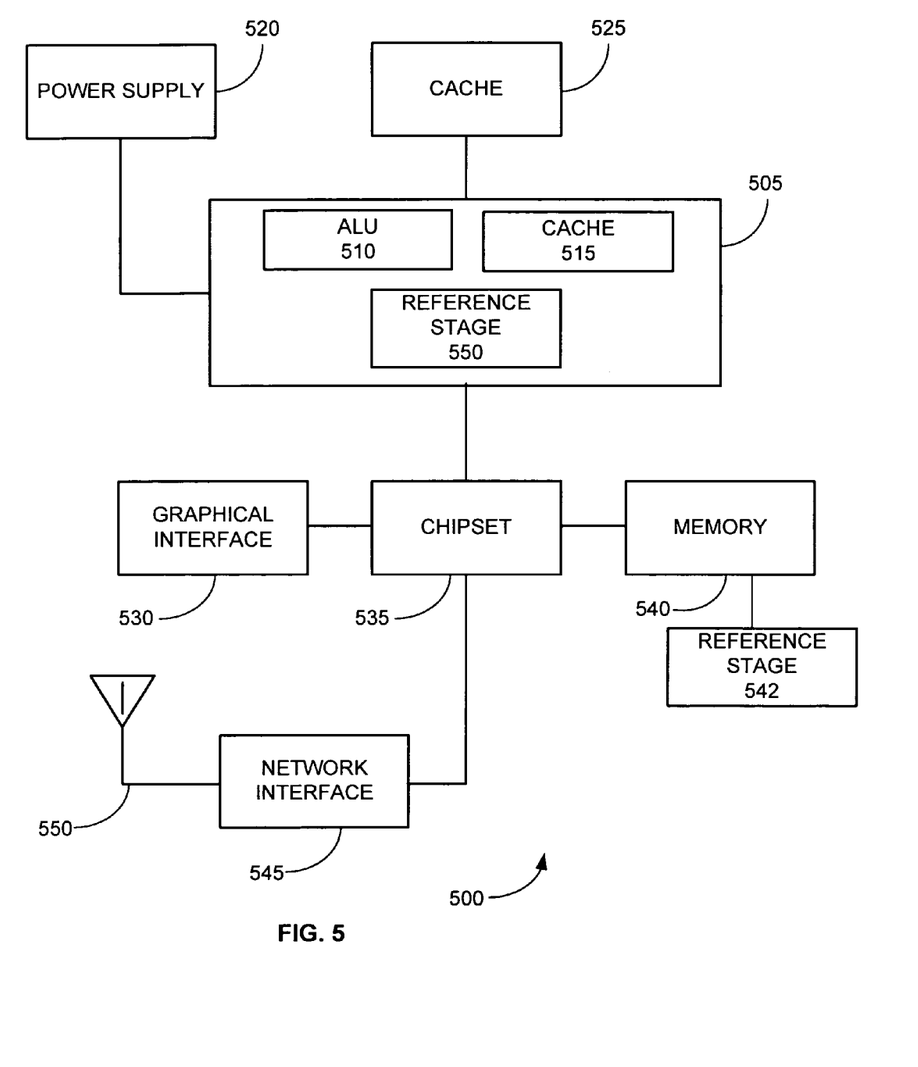
FIG. 5 illustrates a system embodying a high-precision reference circuit according to some embodiments of the present invention.

FIG. 5 illustrates a system embodying a high-precision reference stage 550 according to some embodiments of the present invention. As shown system 500 may include logic devices capable of receiving logic signals including processor 505, arithmatic logic unit (ALU) 510, memory caches 515, 525, power supply 520. System 500 may further include graphical interface 530, chipset 535, memory 540, network interface 545, and an antenna 550, all of which may be coupled (directly or indirectly) to processor 505. Network interface 545 and antenna 550 may enable a logic device, such as processor 505, to send, receive, and process wireless signals. In some embodiments, network interface 545 and antenna 550 may be a single component such as a transceiver, or may be different components. Some embodiments of the present invention may also be adapted to send, receive, and process signals from wired networks.

Processor 505 may include reference stage 550 which may generate a threshold reference for determining the logical stage of stored data stored in an on-chip or off-chip memory such as cache 515 or cache 525. In other embodiments of the present invention, more than one reference stage may be used in conjunction with a single memory. For example, reference stage 542 may generate multiple threshold references for memory 540 as the memory 540 may be a multi-level cell memory. Reference stage 542 may be a component of memory 540 in some system embodiments, and may be a stand alone component in other embodiments. System 500 may be any system capable of receiving and transmitting wireless or wired data signals and may be capable of processing data signals.

Figure 6:
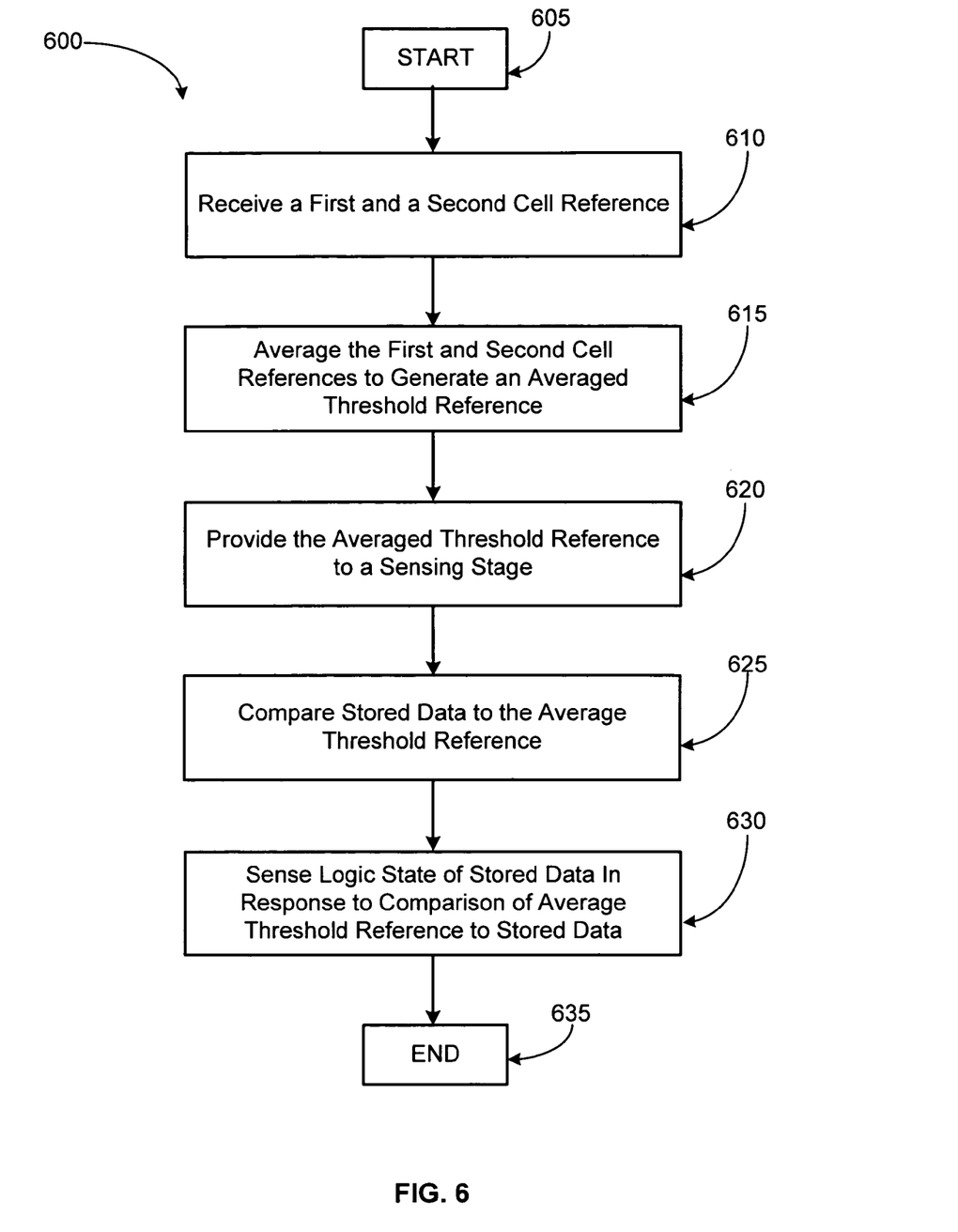
FIG. 6 illustrates a logic flow diagram of a method to produce a high-precision threshold reference according to some embodiments of the present invention.

FIG. 6 illustrates a logic flow diagram of a method to produce a high precision reference according to some embodiments of the present invention. The method 600 may start at 605 and a first and a second cell reference may be received at 610. In another embodiment, 1 to N (or a plurality) of cell references may be received. The cell references may be current values in some embodiments, and may be voltage values in other embodiments. Additionally, the cell references may be matched to a memory element such that one cell reference corresponds to an individual memory element. Next at 615, the first and second cell references may be averaged to generate an averaged threshold reference. In some embodiments of the present invention, the first and second cell references may be averaged utilizing a current mirror configuration. In other embodiments, other collective threshold references may be utilized in response to the first and second cell references. After generating a threshold reference in response to the first and second cell references, an averaged threshold reference may be provided to a sensing stage at 620. In other embodiments, the averaged threshold reference or other type of threshold reference may be provided to additional stages or to another stage capable of sensing the logical state of data stored in a memory.

Next at 625, the average threshold reference may be compared to a voltage or current value associated with the stored data. The stored data may be data bits in some embodiments or may be a continuous stream of data bits or a data signal in some embodiments. The stored data may be stored in volatile memory, non-volatile memory flash memory, or multi-level flash cell memory. If multi-level flash cell memory is utilized, more than one threshold reference may be generated in accordance with the various embodiments of the present invention. After comparing the stored data to the averaged threshold reference, the logic state of the data may be sensed at 630. For example, if the stored data has a current or voltage value greater than the value associated with the averaged threshold reference, then the stored data may be sensed as having a logical high state. Similarly, if the stored data has a current or voltage value less than the value associated with the averaged threshold reference, then the stored data may be sensed as having a logical low stage. The comparing and sensing may be performed in the same or separate stages. After the logic state of the stored data has been sensed, a memory system may output a data signal corresponding to the sensed value of the stored data.

The various embodiments of the present invention have been described with reference to the above discussed embodiments, but the present invention should not be construed to cover only these embodiments. Rather, these embodiments are only exemplary embodiments. Additionally, variations of the above exemplary embodiments may suggest themselves to those skilled in the art or others without departing from the spirit and scope of the present invention. The appended claims and their full range of equivalents should, therefore, only define the full scope of the present invention.

We claim:

1. A device comprising:
   a plurality of cells each adapted to receive a first bias voltage, a second bias voltage, and a reference voltage, and to provide a cell reference;
   an averaging stage coupled to the cells to provide an average reference that is the average of the cell references, wherein the averaging stage comprises two transistors connected in a current mirror configuration with the cells to receive the cell references from the cells and to provide the average reference; and
   wherein the cells comprise a first and a second transistor each having three terminals, wherein:
   the first terminal of the first transistor provides the cell reference to the averaging stage, the second terminal of the first transistor receives the first bias voltage, and the third terminal of the first transistor is connected to the first terminal of the second transistor; and the second terminal of the second transistor receives the second bias voltage and the third terminal of the second transistor is connected to the reference voltage.

2. The device of claim 1 further comprising a third transistor having three terminals, wherein:
the first terminal is connected to a supply voltage, the second terminal is connected to the averaging stage, and the third terminal is connected to the first terminal of the first transistor and the averaging stage.

3. The device of claim 2, wherein the averaging stage comprises a fourth transistor having three terminals, the fourth transistor being one of the two transistors in the averaging stage, wherein:
the first terminal receives the supply voltage, the second terminal is connected to the first terminal of the first transistor in each of the reference cells, and the third terminal provides the average reference.

4. The device of claim 3, wherein the averaging stage further comprises a fifth transistor having three terminals, the fifth transistor being one of the two transistors in the averaging stage, wherein:
the first terminal and the second terminal receive the average reference, and the third terminal is connected to the reference voltage.

5. The device of claim 1, wherein the cell and the average reference are currents.

6. The device of claim 1, wherein the average reference is a voltage.

7. The device of claim 1, wherein the first and second bias voltages are memory cell bias voltages.

8. The device of claim 1, wherein the cells are substantially identical to each other.

9. A non-volatile memory device comprising:
a plurality of memory elements each adapted to provide data having a logic state;
a bias stage adapted to bias the memory elements;
a reference module adapted to provide a reference for each of the memory elements and to provide a threshold reference in response to the references for each of the memory elements;
a sensing stage to compare the threshold reference and the data from the memory elements to sense the logic state of the data,
wherein the reference module comprises two transistors connected in a current mirror configuration to receive the reference for each of the memory elements and to provide the threshold reference, and wherein
the reference module comprises a first, a second, and a third transistor, each having three terminals, and wherein a first terminal of the third transistor is connected to a supply voltage, a second terminal of the third transistor is connected to the averaging stage, and a third terminal of the third transistor is connected to a first terminal of the first transistor.

10. The device of claim 9, wherein the memory elements are volatile or non-volatile memory elements.

11. The device of claim 9, wherein the bias stage provides a drain bias voltage and a gate bias voltage to the memory elements and the reference module.

12. The device of claim 9, wherein the threshold reference is an average of the references for each of the memory elements.

13. The device of claim 9, wherein the threshold reference is a current.

14. The device of claim 9, wherein the threshold reference is a voltage.

15. The device of claim 9, wherein the reference module comprises a plurality of cells matched to the memory elements, and an averaging stage, wherein the cells provide the references to the averaging stage and the averaging stage generates the threshold reference in response to the references.

16. The device of claim 15, wherein:
a first terminal of the first transistor provides the cell reference to the averaging stage, a second terminal of the first transistor receives a first bias voltage, and a third terminal of the first transistor is connected to a first terminal of the second transistor; and
a second terminal of the second transistor receives a second bias voltage and a third terminal of the second transistor is connected to a reference voltage.

17. The device of claim 16, wherein the averaging stage comprises a fourth transistor having three terminals, wherein the first terminal receives the supply voltage, the second terminal is connected to the first terminal of the first transistor in each of the cells, and the third terminal provides the threshold reference.

18. A method comprising:
receiving a first cell reference from a first cell and a second cell reference from a second cell, the first and second cells comprising two transistors each having three terminals;
providing a threshold reference in response to the first and second cell reference
comparing the threshold reference to a first data bit having a logic state; and
sensing the logic state of the first data bit in response to comparing the threshold reference to the first data bit, wherein
a first terminal of the first transistor provides a cell reference to an averaging stage, a second terminal of the first transistor receives a first bias voltage, and a third terminal of the first transistor is connected to a first terminal of the second transistor; and
a second terminal of the second transistor receives a second bias voltage and a third terminal of the second transistor is connected to a reference voltage.

19. The method of claim 18 further comprising averaging the first and second cell reference to provide the threshold reference.

20. The method of claim 18 further comprising:
receiving a plurality of data bits comprising the first data bit;
averaging the cell references to provide the threshold reference; and
sensing the logic state for the data bits by comparing the data bits to the threshold reference.

21. The method of claim 18 further comprising providing the first data bit as a memory device output.

22. A system comprising:
a logic device coupled to a memory, the memory comprising a plurality of memory elements and a reference stage comprising a plurality of cells each providing a cell reference, each of the cells having two transistor with three terminals;
a wireless interface coupled to the logic device to enable the logic device to send and receive wireless signals;
wherein the reference stage provides a threshold reference in response to the cell references, and the memory provides an output in response to the threshold reference and the stored data; and wherein a first terminal of the first transistor provides a cell reference to an averaging stage, a second terminal of the first transistor receives a first bias voltage, and a third terminal of the first transistor is connected to a first terminal of the second transistor; and a second terminal of the second transistor receives a second bias voltage and a third terminal of the second transistor is connected to a reference voltage.

23. The system of claim 22, wherein the reference stage averages the cell references to generate the threshold reference.

24. The system of claim 22 further comprising a sensing stage adapted to determine the logical state of the stored data by comparing the stored data to the threshold reference.

25. The system of claim 22, wherein the logic device is a processor.

26. The system of claim 22, wherein the memory is a non-volatile memory.

27. The system of claim 22, wherein the wireless interface is a transceiver.

28. The system of claim 22, wherein the threshold reference is a current.

29. The system of claim 22, wherein the threshold reference is a voltage.

* * * * *